US008433740B2

(12) United States Patent
Furuya et al.

(10) Patent No.: US 8,433,740 B2
(45) Date of Patent: Apr. 30, 2013

(54) M-SEQUENCE GENERATOR, PROVIDING METHOD THEREOF, AND RANDOM ERROR GENERATING DEVICE IN WHICH M-SEQUENCE GENERATOR IS USED

(75) Inventors: Takashi Furuya, Tama (JP); Masahiro Kuroda, Atsugi (JP); Kazuhiko Ishibe, Koza-gun (JP)

(73) Assignee: Anritsu Corporation, Atsugi-shi (JP)

( * ) Notice: Subject to any disclaimer, the term of this patent is extended or adjusted under 35 U.S.C. 154(b) by 484 days.

(21) Appl. No.: 12/769,341

(22) Filed: Apr. 28, 2010

(65) Prior Publication Data

US 2010/0205235 A1   Aug. 12, 2010

Related U.S. Application Data

(63) Continuation of application No. PCT/JP2008/070702, filed on Nov. 13, 2008.

(30) Foreign Application Priority Data

Nov. 15, 2007   (JP) .................................. 2007-297073

(51) Int. Cl.
*G06F 7/00* (2006.01)
*G06F 1/02* (2006.01)

(52) U.S. Cl.
USPC ........... 708/492; 708/230; 708/252; 708/256; 708/605

(58) Field of Classification Search .................... 708/492
See application file for complete search history.

(56) References Cited

FOREIGN PATENT DOCUMENTS

| JP | 63-221426 | 9/1988 |
|----|-----------|--------|
| JP | 4-117521 | 4/1992 |
| JP | 10-197610 | 7/1998 |
| JP | 2002-330192 | 11/2002 |
| WO | WO 2008/087948 A1 | 7/2008 |

OTHER PUBLICATIONS

ITU-T Telecommunication Standardization Section of ITU O.182; Series O: Specifications of Measuring Equipment; Equipment for the measurement of digital and analogue/digital parameters; Equipment to assess error performance on Optical Transport Network interfaces; Jul. 2007; pp. 1-38.
English translation of the IPRP, issued in Int'l. App. No. PCT/JP2008/070702, mailed Jul. 8, 2010.

*Primary Examiner* — Henry Tsai
*Assistant Examiner* — Dean Phan
(74) *Attorney, Agent, or Firm* — Greer, Burns & Crain, Ltd.

(57) ABSTRACT

An M-sequence generator includes EXCLUSIVE-OR gates feeding back pieces of bit data from m number of series registers to the registers in response to a clock. A period of a cyclic group $\{(\alpha^{1k}), (\alpha^{2k}), (\alpha^{3k}), \ldots\}$ falls within a maximum period $(2^m-1)$, the group being produced as an element $(\alpha^k)$ obtained by raising a root $\alpha$ of a polynomial to a specified power value k ($k \geq 2$), which have the terms in polynomials of a Galois field $GF(2^m)$. In a multiplying unit including the gates, pieces of bit data is fed into one end of the multiplying unit in response to the clock while the element $(\alpha^k)$ is fed into the other end. The multiplying unit performs Galois field multiplication between each piece of bit data and the element $(\alpha^k)$, the gate supplies the multiplication result as feedback bit data to the respective registers.

9 Claims, 12 Drawing Sheets

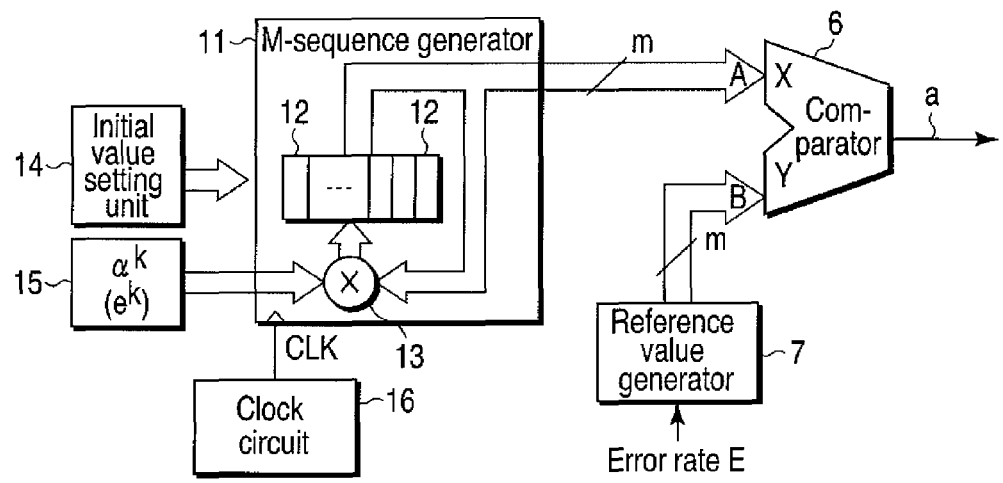
F I G. 1
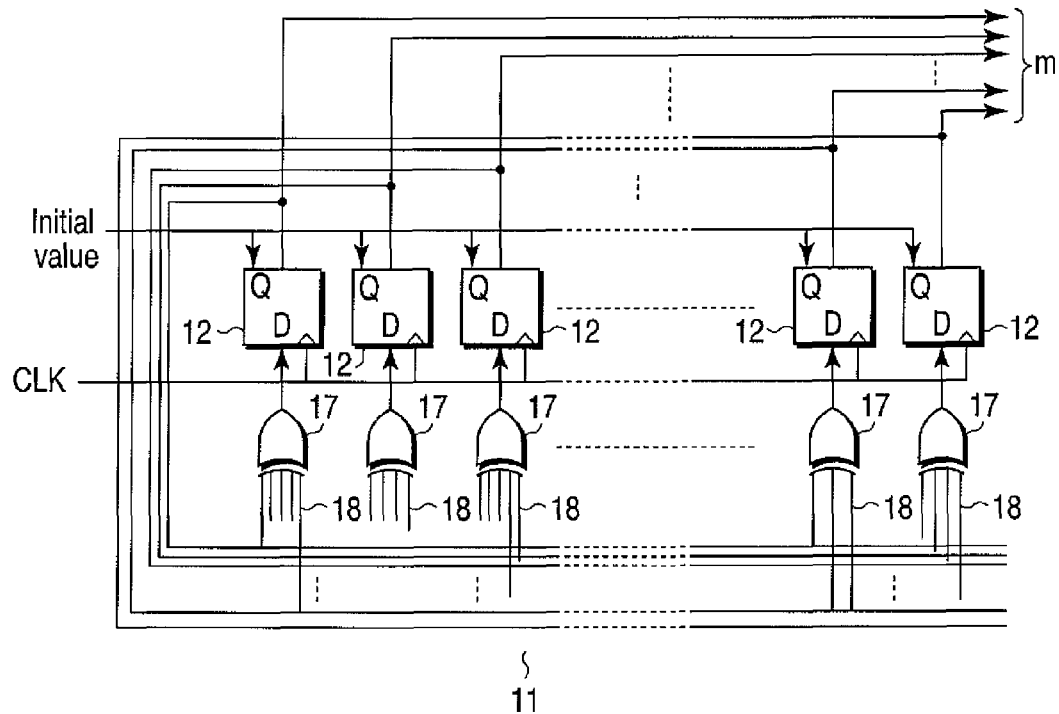
F I G. 2

$v(x) = v_{m-1}x^{m-1} + v_{m-2}x^{m-2} + \cdots + v_1 x + v_0$
$c(x) = c_{m-1}x^{m-1} + c_{m-2}x^{m-2} + \cdots + c_1 x + c_0$
$y(x) = y_{m-1}x^{m-1} + y_{m-2}x^{m-2} + \cdots + y_1 x + y_0$ Power value of ($\alpha^k$)   20

| $\alpha$ \ Column | m-1 | ... | j | ... | 2 | 1 | 0 |
|---|---|---|---|---|---|---|---|
| $\alpha^k$ | 1 | | I | | 1 | 0 | 0 |
| $\alpha^{k+1}$ | | | | | | | |
| | | | I | | | | |
| $\alpha^{k+j}$ | 1 | | o | | 1 | 0 | 1 |
| | | | ⋮ | | | | |
| $\alpha^{k+m-1}$ | | | I | | | | | m=13, Power value of $\alpha^{107}$                    20

T[ 0]=13'b0_1001_0010_1101 :  alpha^(107+0)
T[ 1]=13'b1_0010_0101_1010 :  alpha^(107+1)
T[ 2]=13'b1_0010_1011_0101 :  alpha^(107+2)
T[ 3]=13'b1_0011_0110_1011 :  alpha^(107+3)
T[ 4]=13'b1_0000_1101_0111 :  alpha^(107+4)
T[ 5]=13'b1_0111_1010_1111 :  alpha^(107+5)
T[ 6]=13'b1_1001_0101_1111 :  alpha^(107+6)
T[ 7]=13'b0_0100_1011_1111 :  alpha^(107+7)
T[ 8]=13'b0_1001_0111_1110 :  alpha^(107+8)
T[ 9]=13'b1_0010_1111_1100 :  alpha^(107+9)
T[10]=13'b1_0011_1111_1001 :  alpha^(107+10)
T[11]=13'b1_0001_1111_0011 :  alpha^(107+11)
T[12]=13'b1_0101_1110_0111 :  alpha^(107+12)

($\alpha$=14'b11_0110_0000_0001)

(a)

21

T[ 0] : $Q_0, Q_2, Q_3, Q_4, Q_5, Q_6, Q_7, Q_{10}, Q_{11}, Q_{12}$
T[ 1] : $Q_1, Q_3, Q_4, Q_5, Q_6, Q_7, Q_8, Q_{11}, Q_{12}$
⋮
T[11] : $Q_0, Q_6, Q_8$
T[12] : $Q_0, Q_1, Q_2, Q_3, Q_4, Q_5, Q_6, Q_9, Q_{10}, Q_{11}, Q_{12}$ (b)

F I G. 5

| m | $2^m-1$ | Prime factorization of $(2^m-1)$ | Primitive polynomial |
|---|---|---|---|
| 2 | 3 | Mersenne prime number | 1 |
| 3 | 7 | Mersenne prime number | 2 |
| 4 | 15 | 3×5 | 2 |
| 5 | 31 | Mersenne prime number | 6 |
| 6 | 63 | $3^2$×7 | 6 |
| 7 | 127 | Mersenne prime number | 18 |
| 8 | 255 | 3×5×17 | 16 |
| 9 | 511 | 7×73 | 48 |
| 10 | 1,023 | 3×11×31 | 60 |
| 11 | 2,043 | 23×89 | 176 |
| 12 | 4,095 | $3^2$×5×7×13 | 144 |
| 13 | 8,191 | Mersenne prime number | 630 |
| 14 | 16,383 | 3×43×127 | 756 |
| 15 | 32,767 | 7×31×151 | 1,800 |
| 16 | 65,535 | 3×5×17×257 | 2,048 |
| 17 | 131,071 | Mersenne prime number | 7,710 |
| 18 | 262,143 | $3^3$×7×19×73 | 7,776 |
| 19 | 524,287 | Mersenne prime number | 27,594 |
| 20 | 1,048,575 | 3×$5^2$×11×31×41 | 24,000 |
| 21 | 2,097,151 | $7^2$×127×337 | 84,672 |
| 22 | 4,194,303 | 3×23×89×683 | 120,032 |
| 23 | 8,388,607 | 47×178481 | 356,960 |
| 24 | 16,777,215 | $3^2$×5×7×13×17×241 | 276,480 |
| 25 | 33,554,431 | 31×601×1801 | 1,296,000 |
| 26 | 67,108,863 | 3×2731×8191 | 1,719,900 |
| 27 | 134,217,727 | 7×73×262657 | 4,202,496 |
| 28 | 268,435,455 | 3×5×29×43×113×127 | 4,741,632 |
| 29 | 536,870,911 | 233×1103×2089 | 18,407,808 |
| 30 | 1,073,741,823 | $3^2$×7×11×31×151×331 | 17,820,000 |
| 31 | 2,147,483,647 | Mersenne prime number | 69,273,666 |
| 32 | 4,294,967,295 | 3×5×17×257×65537 | 67,108,864 |

FIG. 9

| m | $2^m-1$ | The number of terms | Primitive polynomial p(x) |
|---|---|---|---|
| 3 | 7 | | $x^3+x+1$ |
| 4 | 15 | | $x^4+x+1$ |
| 5 | 31 | | $x^5+x^2+1$ |
| 6 | 63 | | $x^6+x+1$ |
| 7 | 127 | | $x^7+x+1$ |
| 8 | 255 | 5 | $x^8+x^7+x^2+x+1$ |
| 9 | 511 | | $x^9+x^4+1$ |
| 10 | 1,023 | | $x^{10}+x^3+1$ |
| 11 | 2,047 | | $x^{11}+x^2+1$ |
| 12 | 4,095 | 5 | $x^{12}+x^8+x^2+x+1$ |
| 13 | 8,191 | 5 | $x^{13}+x^5+x^2+x+1$ |
| 14 | 16,383 | 5 | $x^{14}+x^{12}+x^2+x+1$ |
| 15 | 32,767 | | $x^{15}+x+1$ |
| 16 | 65,535 | 5 | $x^{16}+x^{12}+x^3+x+1$ |
| 17 | 131,071 | | $x^{17}+x^3+1$ |
| 18 | 262,143 | | $x^{18}+x^7+1$ |
| 19 | 524,287 | 5 | $x^{19}+x^5+x^2+x+1$ |
| 20 | 1,048,575 | | $x^{20}+x^3+1$ |
| 21 | 2,097,151 | | $x^{21}+x^2+1$ |
| 22 | 4,194,303 | | $x^{22}+x+1$ |
| 23 | 8,388,607 | | $x^{23}+x^5+1$ |
| 24 | 16,777,215 | 5 | $x^{24}+x^7+x^2+x+1$ |
| 25 | 33,554,431 | | $x^{25}+x^3+1$ |
| 26 | 67,108,863 | 5 | $x^{26}+x^6+x^2+x+1$ |
| 27 | 134,217,727 | 5 | $x^{27}+x^5+x^2+x+1$ |
| 28 | 268,435,455 | | $x^{28}+x^3+1$ |
| 29 | 536,870,911 | | $x^{29}+x^2+1$ |
| 30 | 1,073,741,823 | 5 | $x^{30}+x^{23}+x^2+x+1$ |
| 31 | 2,147,483,647 | | $x^{31}+x^3+1$ |
| 32 | 4,294,967,295 | 5 | $x^{32}+x^{22}+x^2+x+1$ |

FIG. 10

| Order m | Primitive polynomial |
|---|---|
| 0 | |
| 1 | |
| 2 | $x^2+x+1$ |
| 3 | $x^3+x+1, x^3+x^2+1$ |
| 4 | $x^4+x+1, x^4+x^3+1$ |

The number of Primitive polynomials $$\lambda(m) = \frac{\phi(2^m-1)}{m}$$

$\phi(\ )$ : Euler's function

F I G. 11

Addition (a)

| | 0 | 1 |
|---|---|---|
| 0 | 0 | 1 |
| 1 | 1 | 0 |

Two-element Galois field

Multiplication (b)

| | 0 | 1 |
|---|---|---|
| 0 | 0 | 0 |
| 1 | 0 | 1 |

Two-element Galois field

F I G. 12

US 8,433,740 B2

M-SEQUENCE GENERATOR, PROVIDING METHOD THEREOF, AND RANDOM ERROR GENERATING DEVICE IN WHICH M-SEQUENCE GENERATOR IS USED

CROSS-REFERENCE TO RELATED APPLICATIONS

This is a Continuation Application of PCT Application No. PCT/JP2008/070702, filed Nov. 13, 2008, which was published under PCT Article 21(2) in Japanese.

This application is based upon and claims the benefit of priority from prior Japanese Patent Application No. 2007-297073, filed Nov. 15, 2007, the entire contents of which are incorporated herein by reference.

BACKGROUND OF THE INVENTION

1. Field of the Invention

The present invention relates to an M-sequence generator, a providing method thereof, and a random error generating device in which the M-sequence generator is used, particularly to a random error generating device that has a specified error rate and supplies a random error signal whose error distribution approximates an error distribution caused by a noise generated in optical communication and electric communication, an M-sequence generator that can be applied to the random error generating device, and a method for providing the M-sequence generator.

2. Description of the Related Art

Generally, in a test apparatus that performs various tests to various communication instruments incorporated in a digital communication network in which an electric signal cable is used or an optical communication network in which an optical fiber cable is used, a test signal matched with actual usage of the communication instrument of a test target is fed into the communication instrument to evaluate a reply operation of the communication instrument.

In one of kinds of evaluation tests of the communication instrument, a test signal intentionally including an error matched with the actual usage is adopted as a test signal fed to the communication instrument of a measurement target.

It is evaluated that the communication instrument is normally operated to what extent of an incidence rate (error rate) E of an error included in the test signal.

For example, Patent Document 1 proposes a random error generating device in which the error is randomly included in the test signal.

Although a detailed configuration of the random error generating device is not clearly described in Patent Document 1, it can be assumed that the random error generating device has the configuration of FIGS. 15 and 16 from the specification and the drawings.

As illustrated in FIG. 16, an example of an M (Maximum length periodic)-sequence generator 1 comprises a series-connected m-stage registers 2 and one or plural EXCLUSIVE-OR gates 3.

When an external clock circuit 4 applies a clock (CLK) to each register 2, a PN (Pseudo Noise) signal that is of a digital series signal having a period of $(2^m-1)$ is supplied from an output terminal 5.

Pieces of bit data stored in m registers 2 are supplied in parallel in each time the clock (CLK) is fed.

The pieces of bit data supplied in parallel from the M-sequence generator 1 are applied to one (X terminal) of input terminals of a comparator 6.

A parallel m-bit reference value that an operator inputs with a reference value setting circuit 7 is fed into the other input terminal (Y terminal) of the comparator 6.

The comparator 6 takes in the parallel m pieces of bit data applied to one (X terminal) of the input terminals as one numerical value A while taking in the parallel m-bit reference value B applied to the other input terminal (Y terminal) also as one numerical value.

When the numerical value A taken in from one (X terminal) of the input terminals is equal to or lower than the reference value B taken in from the other input terminal (Y terminal), the comparator 6 supplies a random error signal a that becomes an error bit.

The reference value B is set according to an error incidence rate (error rate) E of the random error signal a supplied from the random error generating device.

For example, the reference value B is set to "4", when the error rate E is 0.004 (0.4%) and the numerical value A at the X terminal ranges from 1 to 1000.

At this point, the random error signal a having the error rate E of 0.004 is obtained because a probability that the numerical value A is equal to or less than 4 become 4/1000.

Patent Document 1: Jpn. Pat. Appln. KOKAI Publication No. 2002-330192

However, even in the random error generating device of FIGS. 15 and 16, there are following problems to be solved.

For example, in the M-sequence generator 1 of FIG. 15 in which series-connected m registers 2 are incorporated, a sequence of pieces of data that are supplied sequentially from the output terminal 5 in synchronization with the clock from the M-sequence generator 1 changes from the number of installed EXCLUSIVE-OR gates 3 and an installation position.

A period indicating a repetition of the same data stream also changes in the supplied sequence (data stream).

There are plural sequences in which the maximum length periodic sequences $(2^m-1)$ are obtained.

That is, as is well known, the M (maximum length periodic) sequence is expressed by the following periodic sequence in which all the elements except a zero element "0" in a two-element Galois extension Field $(2^m)$ is obtained by the powers of primitive elements $\alpha$.

$$\alpha^0, \alpha^1, \alpha^2, \alpha^3,$$

As used herein, the primitive element $\alpha$ means a special element in which all the elements except the zero element "0" of a Galois field $GF(p^m)$ is produced by the power of $\alpha$.

A Galois field that is obtained by extending a Galois prime field $GF(p)$ is referred to as a Galois extension field $GF(p^m)$. Where p is a prime number and m is a positive integer which is 2 or more. The Galois prime field $GF(p)$ is referred to as a basic field of the Galois extension field $GF(p^m)$.

A polynomial in which an element of the Galois basic field $GF(p)$ is used as a coefficient is referred to as a "polynomial on the Galois basic field $GF(p)$".

When the Galois basic field $GF(p)$ is $GF(2)$, because of the element [0,1], the polynomial has is expressed by the following m-order polynomial in which the elements $(b_0, b_1, b_2, b_3, \ldots,$ and $b_m)$ of the Galois basic field $GF(2)$ are used as the coefficient:

$$q(x) = b_m x^m + b_{m-1} x^{m-1} + \ldots, + b_1 x + b_0$$

Accordingly, there are $(2^{m+1})$ polynomials.

The root of the m-order polynomial $q(x)$ on the Galois basic field $GF(2)$ is x satisfying $q(x)=0$.

When the polynomial $q(x)$ does not have the root that is the element of the Galois basic field $GF(p)$, it is said that the polynomial $q(x)$ is irreducible on the Galois basic field $GF(p)$.

It is also said that the polynomial q(x) is an irreducible polynomial on the Galois basic field GF(p).

For example, when the Galois basic field GF(p) is GF(2), a polynomial $q(x)=x^3+x+1$ is the irreducible polynomial on the Galois basic field GF(p).

This can easily be confirmed by substituting "0" and "1" that are of the elements of the Galois basic field GF(2) for the polynomial q(x).

For example, when x=0 and x=1 are substituted for the polynomial $q(x)=x^3+x+1$, $$q(0)=0^3+0+1\neq 0, \text{ and}$$

$$q(1)=1^3+1+1=1\neq 0$$

are obtained. Therefore, the root of the polynomial q(x) is neither "0" nor "1".

Accordingly, the polynomial q(x) is the irreducible polynomial on the Galois field GF(2).

The polynomial having the maximum length periodic sequence ($2^m-1$) in the irreducible polynomials is defined as a primitive polynomial p(x).

It can easily be proved that the polynomial is the irreducible polynomial p(x) when the number of terms of the polynomial is an odd number.

As illustrated in FIGS. 9 and 10, when the number of orders m increases, there are plural primitive polynomials (primitive polynomial) p(x) in which the maximum length periodic sequences ($2^m-1$) are obtained.

The element that is of the root of the primitive polynomial p(x) becomes the primitive element α.

However, in the conventional M-sequence generator 1, frequently the primitive polynomial p(x) having the minimum number of terms (trinomial or pentanomial) is adopted in order to simplify a circuit configuration.

In the M-sequence generator 1 of FIG. 16, the adopted primitive polynomial p(x) is formed by a trinomial.

$$p(x)=x^{10}+x^3+1$$

Usually the primitive polynomial described in specialized books and literatures is frequently a trinomial or a pentanomial.

However, a probability distribution of a pseudo-random number produced by the M-sequence generator 1 differs largely from a generation probability distribution of the naturally generated noise, and there are following points (a), (b), and (c) that should be improved as a characteristic of the M-sequence generator.

(a) In the M-sequence generator 1 formed by the shift registers, a probability that contents of the shift register become only original contents shifted right or left by one bit with respect to the input of one clock (CLK). Therefore, when the error bit is generated, there is a high possibility that the same error bit is continued over the plural clocks.

Particularly the problem is easily generated when the primitive polynomial p(x) having a small number of terms is selected as the generating polynomial.

For example, FIG. 10 illustrates examples of the primitive polynomials p(x) of order (stage number) m=3 to order m=32, which are adopted in the conventional M-sequence generator 1.

The primitive polynomial p(x) in each order m of FIG. 10 is the primitive polynomial p(x) having the minimum number of terms in the plural primitive polynomials p(x) of the corresponding order m of FIG. 9.

The primitive polynomial p(x) in which the minimum number of terms is an odd number is the trinomial as illustrated in FIG. 10, the primitive polynomial p(x) of the trinomial does not always exist with respect to any order (stage number) m.

For example, for the order (stage number) m=8, the primitive polynomial p(x) having the minimum number of terms is the following pentanomial.

$$p(x)=x^8+x^7+x^2+x+1$$

At least the primitive polynomial p(x) having the minimum number of terms is selected.

When the number of terms of the adopted primitive polynomial p(x) decreases, the number of pieces of bit data decreases in the M-sequence generator 1 of FIG. 16, wherein the number of pieces of bit data is fed back from the subsequent registers 2 to the leading register 2 through the EXCLUSIVE-OR gate 3.

As a result, there is a probability that the same value of "1" or "0" is continued in the bit data string of the maximum length periodic sequence ($2^m-1$) sequentially supplied from the M-sequence generator 1 in synchronization with the clock (CLK).

Accordingly, the further randomized error distribution that is of the target is not obtained in the M-sequence generator 1.

(b) In the M (maximum length periodic)-sequence generator 1, the probability distribution of the pseudo-random number produced by the M (maximum length periodic)-sequence generator 1 cannot be brought close to the generation probability distribution of the naturally generated noise only by increasing the order (stage number) m, that is, lengthening the period.

It is necessary that the period of the maximum length periodic sequence be lengthened in order to improve the probability distribution characteristic.

However, when the period is more than a certain value, a contribution ratio of the lengthened period is reduced to the improvement of the generation probability distribution characteristic.

For example, the period of ($2^{127}-1$), that is, the periodic sequence of about $1.7\times 10^{38}$ is obtained in the M-sequence generator 1 in which the 127-stage (m=127) shift register is used.

In fact, the period of about $1.7\times 10^{38}$ is equal to an infinite length.

However, in the actual test measurement, there is a need for the excellent probability distribution characteristic in a relatively short test time.

It is clear that only lengthening the period of the periodic sequence cannot deal with the need.

In the M-sequence generator 1 and random error generating device, advantageously the circuit scale can be minimized, and the high-speed operation can be performed. At the same time, there still is a room for improvement in the probability distribution characteristic and probability process characteristic of the supplied random error signal.

(c) In the M-sequence generator 1 of FIG. 16, when the M-sequence generator 1 is realized on an application program of a computer, each pieces of data fed into and supplied from each register 2 is obtained by the Galois field multiplication including the primitive polynomial p(x).

However, in such cases, the Galois field multiplication cannot be realized only by one clock (CLK) supplied from the clock circuit 4.

That is, as illustrated in FIG. 16, in the M-sequence generator 1 comprising the 10-stage (order m=10) shift register 2, because each register 2 takes in data of the preceding-stage register 2 in response to the clock, the Galois field multiplication of the primitive polynomial $p(x)=x^{10}+x^3+1$ of the trinomial in the order m=10 of FIG. 10 is not completed only by one clock (CLK) supplied from the clock circuit 4.

10 clocks (CLK) for the order m (=10) of the registers 2 are required in FIG. 16.

Accordingly, the high-speed performance is degraded in the random error generating device comprising the M-sequence generator 1 of FIG. 16.

BRIEF SUMMARY OF THE INVENTION

In view of the foregoing, an object of the invention is to provide a random error generating device that supplies a random error signal, which is more random than that approximating the error distribution caused by noise generated in the optical communication or electric communication, without excessively largely setting the circuit scale used, an M-sequence generator that can be applied to the random error generating device, and an M-sequence generator providing method.

In order to achieve the object, according to a first aspect of the invention, there is provided an M-sequence generator (11) including a plurality of series-connected registers (12) and a plurality of EXCLUSIVE-OR gates (17) which feed back pieces of bit data stored in the registers (12) to the registers (12) in each time a clock (CLK) is fed into said plurality of registers (12), the pieces of bit data being supplied in parallel from said each register (12), wherein a period of a cyclic group $\{(\alpha^{1k}), (\alpha^{2k}), (\alpha^{3k}), \ldots\}$ falls within a maximum length period ($2^m-1$), the cyclic group $\{(\alpha^{1k}), (\alpha^{2k}), (\alpha^{3k}), \ldots\}$ being produced as an element ($\alpha^k$) that is of a generating element ($\alpha^k$), the element ($\alpha^k$) being obtained by raising a root $\alpha$ of a polynomial to a specified power value k of 2 or more ($k \geq 2$), the polynomial having the large number of terms in a plurality of polynomials of a Galois field GF($2^m$) in which the number m (m is a positive integer which is 2 or more) of plurality of registers (12) is set to an order m, and the M-sequence generator (11) comprises a Galois field multiplying unit (13) comprising said plurality of EXCLUSIVE-OR gates (17), pieces of bit data supplied in parallel from the registers (12) is fed into one end of the Galois field multiplying unit (13) in each time the clock (CLK) is fed while the generating element ($\alpha^k$) is fed into the other end, the Galois field multiplying unit (13) performing Galois field multiplication between said each piece of bit data and the generating element ($\alpha^k$), the EXCLUSIVE-OR gate (17) supplying the Galois field multiplication result as feedback bit data to each register (12) in parallel.

In the M-sequence generator (11) comprising m (m is a positive integer which is 2 or more) registers (12) having the configuration of the first aspect of the invention, the primitive polynomial having the large number of terms is adopted in the plural primitive polynomials p(x) in the two-element Galois extension field GF ($2^m$) having the order m in which the maximum length period ($2^m-1$) can be realized.

As described above, the primitive polynomial p(x) having the small number of the terms is adopted in the primitive polynomial p(x) adopted in the conventional M-sequence generator (1).

On the other hand, the primitive polynomial p(x) having the large number of the terms is adopted in the invention.

In comparison with the conventional technique and the invention, on the condition that the maximum length period ($2^m-1$) is equal, the number of pieces of bit data fed back to each register (12) in the M-sequence generator (11) from the registers (12) including the own register through the EXCLU-SIVE-OR gate (17) increases as the number of terms increases in the primitive polynomial p(x).

As a result, the probability that the same value of "1" or "0" is continued is decreased in the bit data string of the maximum length period ($2^m-1$), which is sequentially supplied from the M-sequence generator (11) in synchronization with the clock (CLK).

Additionally, in the invention, the Galois field multiplying unit (13) performs the Galois field multiplication between the generating element ($\alpha^k$) and the plural pieces of bit data supplied in parallel from the registers (12) in each time the clock (CLK) is fed.

The power value with which the Galois field multiplication is performed to the pieces of bit data fed back from the first to m-th registers (12) including the own j-th register (12) is not the power values ($\alpha^1, \alpha^2, \ldots,$ and $\alpha^m$) of the conventional primitive element $\alpha$, but the power values ($\alpha^k, \alpha^{k+1}, \alpha^{k+2}, \ldots,$ and $\alpha^{k+m-1}$) of the specified power value $\alpha^k$ with respect to the primitive element $\alpha$.

Accordingly, the bit data value fed into each of the first to m-th registers (12) is further randomized.

In order to achieve the object, according to a second aspect of the invention, there is provided the M-sequence generator (11) according to the first aspect, wherein, when one of the roots of the polynomial is not the $\alpha$ but e, a period of a cyclic group $\{(e^{1k}), (e^{2k}), (e^{3k}), \ldots\}$ falls within the maximum length period ($2^m-1$), the cyclic group $\{(e^{1k}), (e^{2k}), (e^{3k}), \ldots\}$ being produced as an element ($e^k$) that is of a generating element ($e^k$), the element ($e^k$) being obtained by raising the root e of the polynomial to a specified power value k of at least 2 ($k \geq 2$), in the Galois field multiplying unit (13), in each time the clock (CLK) is fed, pieces of bit data supplied in parallel from the registers (12) is fed into one end while the generating element ($e^k$) is fed into the other end, and the Galois field multiplying unit (13) performs Galois field multiplication between said each piece of bit data and the generating element ($\alpha^k$).

In the M-sequence generator (11) having the configuration of the second aspect of the invention, the adopted polynomial (generating polynomial) is not limited to the primitive polynomial p(x), but one polynomial is adopted as the generating polynomial.

Accordingly, the period of the bit data supplied from the actual M-sequence generator is not always matched with the maximum length period ($2^m-1$).

However, a degree of freedom of the design in which the number m of registers (12) used is arbitrarily set can be secured in the M-sequence generator (11).

In order to achieve the object, according to a third aspect of the invention, there is provided a method for providing an M-sequence generator (11) comprising a plurality of series-connected registers (12) and a plurality of EXCLUSIVE-OR gates (17) which feed back pieces of bit data stored in the registers to the registers (12) in each time a clock (CLK) is fed into said plurality of registers (12), the pieces of bit data being supplied in parallel from said each register (12), the M-sequence generator providing method comprising:

a register number selecting step of selectively setting the number m (m is a positive integer) of said plurality of registers (12) to 3 or more;

a primitive polynomial searching step of searching a plurality of m-order primitive polynomials in a two-element Galois extension field GF($2^m$) in which the number m of said plurality of registers selected in the register (12) number selecting step is set to the order m from a database;

a primitive polynomial selecting step of selecting one of said plurality of primitive polynomials searched in the primitive polynomial searching step;

a primitive element computing step of obtaining a primitive element α from the database, the primitive element α being a root of the one primitive polynomial selected in the primitive polynomial selecting step;

a specified power value selecting step of selecting a specified power value $\alpha^k$ having the power of at least two when the two-element Galois extension field GF($2^m$) is expressed by a series of the power of primitive element α;

a power value computing step of computing power values ($\alpha^k$, $\alpha^{k+1}$, $\alpha^{k+2}$, ..., $\alpha^{k+m-1}$) of specified reference power values $\alpha^k$ that is used to perform Galois field multiplication to data values fed back to each of first to m-th registers (12) of the series-connected plurality of registers (12) of the specified reference power value $\alpha^k$ selected in the specified power value selecting step;

a Galois field multiplying unit (13) setting step of setting a (13) in each time the clock (CLK) is fed into the series-connected plurality of registers (12), the Galois field multiplying unit (13) performing Galois field multiplication of the power value ($\alpha^k$) to the values of the pieces of bit data fed back to said each register (12); and a feedback path producing step of producing a feedback path from the corresponding register (12) to the register (12) in which a place indicates bit data through said plurality of EXCLUSIVE-OR gates (17) constituting the Galois field multiplying unit (13), when the place corresponding to said each register of power values ($\alpha^k$, $\alpha^{k+1}$, $\alpha^{k+2}$, ..., $\alpha^{k+m-1}$) corresponding to said each register (12) computed in the power value computing step has a value of "1".

The effect substantially identical to that of the M-sequence generator (11) can be obtained in the M-sequence generator providing method of the third aspect of the invention.

Additionally, in the M-sequence generator providing method of the third aspect of the invention, as illustrated in (a) and (b) of FIG. 12, the addition corresponds to EXCLUSIVE-OR (XOR) of the real computation and the multiplication corresponds to AND of the real computation in the two-element Galois field GF(2) due to the definition of the Galois field multiplication in the Galois field multiplying unit (13) that performs the Galois field multiplication of the data of each register (12) and the specified power value ($\alpha^k$).

Accordingly, only when the place corresponding to each register (12) of each power value ($\alpha^k$, $\alpha^{k+1}$, $\alpha^{k+2}$, ..., $\alpha^{k+m-1}$) has the value "1", it is necessary to form a feedback path from the corresponding register (12) to the register (12) whose place indicates the bit data through the plural EXCLUSIVE-OR gates (17) constituting the Galois field multiplying unit (13).

In order to achieve the object, according to a fourth aspect of the invention, there is provided a random error generating device comprising:

an M-sequence generator (11) that comprises a plurality of series-connected registers (12) and a plurality of EXCLUSIVE-OR gates (17) which feed back pieces of bit data stored in the registers to the registers (12) in each time a clock (CLK) is fed into said plurality of registers (12), the pieces of bit data being supplied in parallel from said each register (12); and a comparator (6) in which a plurality of pieces of bit data supplied in parallel from the M-sequence generator (11) in synchronization with the clock (CLK) is fed into one end, said plurality of pieces of fed bit data being taken in as one numerical value, the comparator (6) supplying a random error signal that becomes an error bit when a numerical value of said plurality of pieces of bit data is equal to or lower than a reference value corresponding to a specified error rate fed into the other end, wherein, in the M-sequence generator (11), a period of a cyclic group {($\alpha^k$, $\alpha^{2k}$, $\alpha^{3k}$), ...} falls within a maximum length period ($2^m$-1), the cyclic group {($\alpha^k$, $\alpha^{2k}$, $\alpha^{3k}$), ...} being produced as an element ($\alpha^k$) that is of a generating element ($\alpha^k$), the element ($\alpha^k$) being obtained by raising a root α of a polynomial to a specified power value k of 2 or more (k≧2), the polynomial having the large number of terms in a plurality of polynomials of a Galois field GF($2^m$) in which the number m (m is a positive integer which is 2 or more) of plurality of registers is set to an order m, and the M-sequence generator (11) comprises a Galois field multiplying unit (13) comprising said plurality of EXCLUSIVE-OR gates (17), pieces of bit data supplied in parallel from the registers is fed into one end of the Galois field multiplying unit (13) in each time the clock (CLK) is fed while the generating element ($\alpha^k$) is fed into the other end, the Galois field multiplying unit (13) performing Galois field multiplication between said each piece of bit data and the generating element ($\alpha^k$), the EXCLUSIVE-OR gate (17) supplying the Galois field multiplication result as feedback bit data to each register (12) in parallel.

In the M-sequence generator (11) comprising the m registers incorporated in the random error generating device of the fourth aspect of the invention, the primitive polynomial having the large number of terms is adopted in the plural primitive polynomials p(x) in the two-element Galois extension field GF ($2^m$) having the order m in which the maximum length period ($2^m$-1) can be realized.

As described above, the primitive polynomial p(x) having the small number of the terms is adopted in the primitive polynomial p(x) adopted in the conventional M-sequence generator (1).

On the other hand, the primitive polynomial p(x) having the large number of the terms is adopted in the invention.

In comparison with the conventional technique and the invention, on the condition that the maximum length period ($2^m$-1) is equal, the number of pieces of bit data fed back to each register (12) in the M-sequence generator (11) from the registers (12) including the own register through the EXCLUSIVE-OR gate (17) increases as the number of terms increases in the primitive polynomial p(x).

As a result, the probability that the same value of "1" or "0" is continued is decreased in the bit data string of the maximum length period ($2^m$-1), which is sequentially supplied from the M-sequence generator (11) in synchronization with the clock (CLK).

Accordingly, the further randomized error distribution that is of the target is obtained in the invention.

Additionally, in the invention, the Galois field multiplying unit (13) performs the Galois field multiplication between the generating element ($\alpha^k$) and the plural pieces of bit data supplied in parallel from the registers (12) in each time the clock (CLK) is fed.

The power value with which the Galois field multiplication is performed to the pieces of bit data fed back from the first to m-th registers (12) including the own j-th register (12) is not the power values ($\alpha^1$, $\alpha^2$, ..., and $\alpha^m$) of the conventional primitive element α, but the power values ($\alpha^k$, $\alpha^{k+1}$, $\alpha^{k+2}$, ..., and $\alpha^{k+m-1}$) of the specified power value $\alpha^k$ with respect to the primitive element α.

Accordingly, the bit data value fed into each of the first to m-th registers (12) is further randomized.

In the random error generating device in which the M-sequence generator (11) having the configuration of the fourth aspect of the invention, the M-sequence generator (11) supplies the pieces of bit data stored in the m registers (12) of the M-sequence generator (11) in parallel in each time the clock (CLK) is fed.

The pieces of bit data supplied in parallel from the M-sequence generator (11) are applied to one of the input terminals of the comparator (6).

The reference value is fed into the other input terminal of the comparator (6).

Therefore the comparator (6) supplies the random error signal that becomes the error bit when the numerical value of each piece of bit data taken in from one of the input terminals is equal to or lower than the reference value taken in from the other input terminal.

Accordingly, the random error generating device supplies the further randomized random error signal having the specified error rate.

In order to achieve the object, according to a fifth aspect of the invention, there is provided the random error generating device according to the fourth aspect, wherein a feedback path of bit data stored in each register (12) is defined with respect to each register through said plurality of EXCLUSIVE-OR gates (17) by Galois field multiplication between a plurality of pieces of bit data supplied in parallel from said each register (12) in each time the clock (CLK) is fed and the generating element ($\alpha^k$).

In order to achieve the object, according to a sixth aspect of the invention, there is provided the random error generating device according to the fourth aspect, including:

a plurality of M-sequence generators ($23_1, 23_2, \ldots, 23_n$) as the M-sequence generator (11); and a data position replacing circuit into which a plurality of pieces of bit data supplied in parallel from each of said plurality of M-sequence generators ($23_1, 23_2, \ldots, 23_n$) in synchronization with a clock (CLK), the data position replacing circuit (26) replacing data positions of said plurality of pieces of bit data, wherein said plurality of pieces of bit data whose data positions are replaced by the data position replacing circuit (26) are fed into one end of the comparator (6).

In the random error generating device having the configuration of the sixth aspect of the invention, the plural M-sequence generators ($23_1, 23_2, \ldots,$ and $23_n$) are incorporated, and the data position replacing circuit (26) replaces data positions of the plural pieces of bit data supplied in parallel from the M-sequence generators ($23_1, 23_2, \ldots,$ and $23_n$) in synchronization with the clock (CLK) over the pieces of bit data of all the M-sequence generators ($23_1, 23_2, \ldots,$ and $23_n$). Then the plural pieces of bit data are fed into one end of the comparator (6).

Accordingly, the numerical value including the parallel pieces of bit data fed into one end of the comparator (6) in synchronization with the clock (CLK) can securely be prevented from becoming the same value as the numerical value in the previous clock (CLK).

The period that is substantially equal to that of the one M-sequence generator (11) of the first and second aspects of the invention is realized in the plural M-sequence generators ($23_1, 23_2, \ldots,$ and $23_n$).

At this point, the circuit configuration that obtains the substantially equal period is simplified because the plural M-sequence generators ($23_1, 23_2, \ldots,$ and $23_n$) are provided.

In order to achieve the object, according to a seventh aspect of the invention, there is provided the random error generating device according to the fourth aspect, wherein numbers m (m is a positive integer more than 1) of said plurality of registers (12) have a relatively prime relationship, a plurality of M-sequence generators ($23_1, 23_2, \ldots, 23_n$) is provided as the M-sequence generator (11), and a plurality of pieces of bit data supplied in parallel from each of said plurality of M-sequence generators ($23_1, 23_2, \ldots, 23_n$) in synchronization with a clock (CLK) are fed into one end of the comparator (6) over pieces of bit data of all the M-sequence generators.

In the random error generating device having the configuration of the seventh aspect of the invention, the data position replacing circuit (26) is removed from the random error generating device of the fourth aspect of the invention, and the plural pieces of bit data supplied from the M-sequence generators ($23_1, 23_2, \ldots,$ and $23_n$) are directly fed in parallel into one end of the comparator (6) over all the M-sequence generators ($23_1, 23_2, \ldots,$ and $23_n$).

At this point, because the number m of registers (12) of each M-sequence generator ($23_1, 23_2, \ldots,$ and $23_n$) is maintained at the relatively prime relationship, the M-sequence generators ($23_1, 23_2, \ldots,$ and $23_n$) differ from one another in the period of a code string formed by the data stream of the plural pieces of bit data supplied from each of the M-sequence generators ($23_1, 23_2, \ldots,$ and $23_n$). Therefore, the period of the code string formed by the data stream of the plural pieces of bit data fed into one end of the comparator (6) can be lengthened over all the M-sequence generators ($23_1, 23_2, \ldots,$ and $23_n$).

In order to achieve the object, according to an eighth aspect of the invention, there is provided the random error generating device according to the fourth aspect, wherein the number m of said plurality of registers (12) is set to a prime number such that the maximum length period ($2^m-1$) becomes a Mersenne prime number, the number of selected primitive polynomials is set about half the number m of registers (12), and a power k of the specified power value $\alpha^k$ is set to about ⅓ of the maximum length period ($2^m-1$).

The number m of registers is set to a value that is a prime number and a value that becomes a Mersenne prime number in which the maximum length period ($2^m-1$) is a prime number.

FIG. 9 illustrates a relationship between the number of registers m (order m) and the Mersenne prime number.

There are 12 numbers "2, 3, 5, 7, 13, 17, 19, 31, 61, 89, 107, and 127" in the number m (order m) of registers satisfying both the "prime number" and "Mersenne prime number".

The primitive polynomial p(x) whose period is the maximum length period ($2^m-1$) can securely be selected by selecting one of the 12 numbers m of registers (order m).

The circuit configuration can be simplified while the good random characteristic is maintained by selecting the primitive polynomial p(x) having the number of terms that is about half the number m of registers.

In order to achieve the object, according to a ninth aspect of the invention, there is provided the random error generating device according to the fourth aspect, further including an initial setting unit (14) which initially sets a pseudo-random number value to said each register (12)

The randomness of the pieces of bit data supplied in parallel from the registers (12) can further be improved by initially setting the pseudo-random number values to the registers (12).

As described above, in the random error generating device, M-sequence generator, and M-sequence generator providing method of the invention, the random error signal which is more random than that approximating the error distribution caused by the noise generated in the optical communication or electric communication can be realized without excessively largely setting the circuit scale used.

BRIEF DESCRIPTION OF THE SEVERAL VIEWS OF THE DRAWING

FIG. 1 is a block diagram illustrating a schematic configuration of a random error generating device in which an M-sequence generator according to a first embodiment of the invention is incorporated.

FIG. 2 is a block diagram illustrating a schematic circuit of the M-sequence generator incorporated in the random error generating device of FIG. 1.

FIG. 5 (a) and (b) illustrates a data list of specified power values ($\alpha^k$) for providing the M-sequence generator incorporated in the random error generating device of FIG. 1 and a list of selected register.

FIG. 9 is a view illustrating a relationship between an order m and the number of primitive polynomials in a two-element Galois extension field GF (2 m) used in the M-sequence generator providing method of FIG. 8.

FIG. 10 is a view illustrating a primitive polynomial of each order m in the two-element Galois extension field GF (2 m) used in the M-sequence generator providing method of FIG. 8.

FIG. 11 is a view illustrating a primitive polynomial of each order m in the two-element Galois extension field GF (2 m) used in the M-sequence generator providing method of FIG. 8.

FIG. 12 (a) and (b) illustrates definitions of addition and multiplication in the two-element Galois extension field GF (2 m) used in the M-sequence generator providing method of FIG. 8.

DETAILED DESCRIPTION OF THE INVENTION

Embodiments of the invention will be described below with reference to the drawings.

First Embodiment

FIG. 1 is a schematic configuration diagram of a random error generating device in which an M-sequence generator according to a first embodiment of the invention is incorporated.

Figure 15:
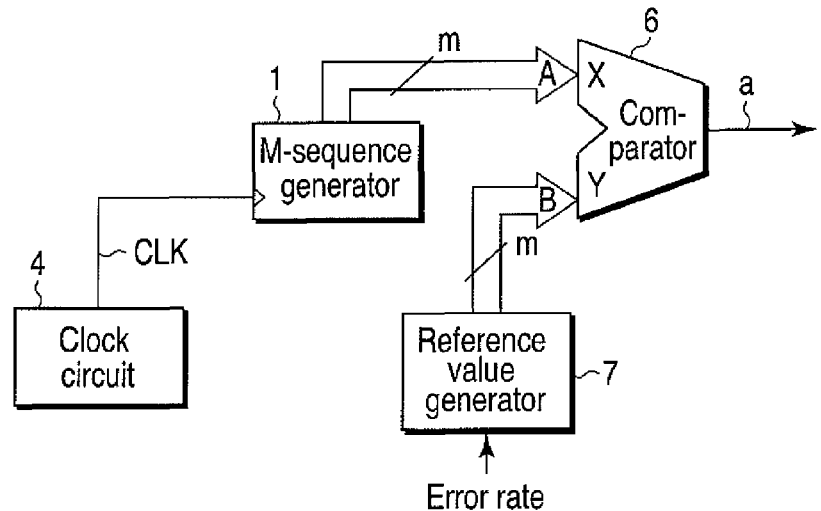
FIG. 15 is a block diagram illustrating a schematic configuration of a conventional random error generating device.

In FIG. 1, the same component as the conventional random error generating device of FIG. 15 is denoted by the same numeral, and the overlapping description is omitted.

An M (maximum length periodic)-sequence generator 11 includes m (m is a positive integer which is 2 or more) registers 12 and a Galois field multiplying unit 13.

An initial value setting unit 14 sets a one-bit initial value of nonzero constituting a pseudo-random number to each of 0-th to (m−1)-th registers 12 in starting up the M-sequence generator 11.

A specified power value setting unit 15 applies a specified power value $\alpha^k$ to one end of the Galois field multiplying unit 13. The specified power value $\alpha^k$ is a primitive element $\alpha$ to the power of specified power k, and the primitive element $\alpha$ is one of roots of an m-order primitive polynomial p(x) adopted in the M-sequence generator 11.

The value of k and the value of $2^m-1$ are relatively prime.

The specified power value $\alpha^k$ has a binary m-bit configuration.

In each time the clock (CLK) supplied from the clock circuit 16, the Galois field multiplying unit 13 performs Galois field multiplication of the specified power value ($\alpha^k$) (=constant), and the Galois field multiplying unit 13 writes the Galois field multiplication result in each register 12. The specified power value ($\alpha^k$) is applied from the specified power value setting unit 15 to a bit data value (=variable) supplied from each register 12.

In each time the clock (CLK) supplied from the clock circuit 16, the M-sequence generator 11 supplies the pieces of bit data stored in the m registers 12 in parallel.

The pieces of bit data supplied in parallel from the M-sequence generator 11 are applied to one (X terminal) of the input terminals of the comparator 6.

The parallel m-bit reference value that an operator inputs with the reference value setting circuit 7 is fed into the other input terminal (Y terminal) of the comparator 6.

The comparator 6 takes in the parallel m pieces of bit data applied to one (X terminal) of the input terminals as one numerical value A while taking in the parallel m-bit reference value B applied to the other input terminal (Y terminal) also as one numerical value.

When the numerical value A taken in from one (X terminal) of the input terminals is equal to or lower than the reference value B taken in from the other input terminal (Y terminal), the comparator 6 supplies the random error signal a that becomes an error bit.

The reference value B is set according to the error incidence rate (error rate) E of the random error signal a supplied from the random error generating device.

Accordingly, the random error signal a having the specified error rate is obtained from the random error generating device.

The M-sequence generator 11 has a configuration of FIG. 2 when the Galois field multiplying unit 13 of the M-sequence generator 11 incorporated in the random error generating device of FIG. 1 is replaced with an actual circuit element.

That is, in each time the clock (CLK) is fed into each register 12, the M-sequence generator 11 feeds back the pieces of bit data stored in the registers 12 to the register 12 including the own register 12 through plural EXCLUSIVE-OR gates 17.

A specific computing procedure for realizing the M-sequence generator 11 in which the m registers 12 and plural EXCLUSIVE-OR gates 17 of FIG. 2 are incorporated by the Galois field multiplication in the Galois field multiplying unit 13 will be described with reference to FIG. 3.

In each time the clock (CLK) is fed into each register 12, it is assumed that v(x) (=variable) is the bit data value supplied from each register 12, it is assumed that c(x) (=constant) is the specified power value ($\alpha^k$) applied from the specified power value setting unit 15, and it is assumed that multiplication result y(x) of the Galois field multiplication is the bit data fed back to each register 12.

The following equations are obtained when the values v(x), c(x), and y(x) are expressed by polynomial.

$$v(x) = v_{m-1}x^{m-1} + v_{m-2}x^{m-2} + \ldots + v_1 x + v_0$$

$$c(x) = c_{m-1}x^{m-1} + c_{m-2}x^{m-2} + \ldots + c_1 x + c_0$$

$$y(x) = y_{m-1}x^{m-1} + y_{m-2}x^{m-2} + \ldots + y_1 x + y_0$$

$$y(x) = c(x) \cdot v(x)$$

At this point, a coefficient of each order in all the polynomials is an element of the Galois basic field GF(2), and c(x) is a constant. Therefore, the following coefficient sequence is given in the Galois basic field GF(2).

$$c_{m-1}, c_{m-2}, \ldots, +c_1, \text{ and } c_0$$

Accordingly, $x^0 c(x), x^1 c(x), x^2 c(x), x^3 c(x), \ldots,$ and $x^{m-1} c(x)$ can previously be computed.

Each element of the generating polynomial of the first embodiment can be expressed by the polynomial. Therefore, assuming that c(x) is an element of the Galois field GF(16) produced by the generating polynomial $f(x) = x^4 + x + 1$ and c(x)=x, the following (4×4) matrix T is obtained.

[Formula 1]
$$\begin{bmatrix} x^1 \\ x^{2(=1+1)} \\ x^{3(=1+2)} \\ x^{4(=1+3)} = x+1 \end{bmatrix} = \begin{bmatrix} 0 & 0 & 1 & 0 \\ 0 & 1 & 0 & 0 \\ 1 & 0 & 0 & 0 \\ 0 & 0 & 1 & 1 \end{bmatrix} = T$$

The coefficients $y_0, y_1, y_2, \ldots,$ and $y_{m-1}$ of y(x) that provides the result of $y(x) = c(x) \cdot x$ can be obtained based on the matrix T.

For example, the equation $y_0 = v_3$ is obtained as 0-order coefficient $y_0$ of y(x) by seeing a third row of "1" of a final row of a right-end fourth column in the right matrix T.

Similarly the equation $y_1 = v_3 + v_0$ is obtained as 1-order coefficient $y_1$ of y(x) by seeing the third row of "1" of the final row of a third column and a leading row (0-row) of "1" in the right matrix T.

The coefficients $y_0$ to $y_3$ of y(x) can be simplified and expressed by the coefficients $v_0$ to $v_3$ of v(x).

$$y_0 = v_3, y_1 = v_3 + v_0, y_2 = v_1, \text{ and } y_3 = v_2$$

This means which output of the register 12 should be fed back to each register 12 is uniquely determined when the matrix T of each element of the Galois field GF( ) expressed by the generating polynomial f(x) is determined.

In other others, which bit data of the register 12 is fed back to each register 12 is determined by a value of "1" or "0" of each place of the m-bit-configuration specified power value ($\alpha^k$) applied from the specified power value setting unit 15.

The polynomials v(x) and y(x) are expressed by row vectors V and Y. Each element of the row vectors V and Y is each coefficient of the polynomials v(x) and y(x), and the each of the row vectors V and Y has four elements.

$$V = [v_3 v_2 v_1 v_0]$$

$$Y = [y_3 y_2 y_1 y_0]$$

Therefore, as described below, the multiplication result y(x) of the Galois field multiplication "$y(x) = c(x) \cdot v(x)$" can be expressed by the four-element row vector, which is a product of the four-element row vector and the 4×4 matrix T.

$$Y = V \times T$$

Then it is considered that the generating element ($\alpha^k$) that is obtained by the specified power value k of the element is fed as a constant into the Galois field multiplying unit 13.

In such cases, because $\alpha$ is one of roots of one polynomial f(x) of the Galois extension field GF($2^m$), when $\alpha$ is expressed in the polynomial form, a becomes an m-element row of "1" or "0".

$$\alpha = [a_{m-1} a_{m-2} \ldots a_1 a_0]$$

$\alpha^2$ is obtained by multiplying $\alpha$ by $\alpha$.

When the previously obtained value is multiplied in order, the m-element row of "1" or "0" of the generating element ($\alpha^k$) is obtained.

$$\alpha^k = [a_{m-1} a_{m-2} \ldots a_1 a_0]$$

Because the m×m Galois field multiplication of variable× constant is required, the m-element row of "1" or "0" expressed in the polynomial form of power values $\alpha^k, \alpha^{k+1}, \alpha^{k+2}, \ldots,$ and $\alpha^{k+m-1}$ is computed.

As a result, the (m+m) matrix T is obtained.

Figures 3, 4:
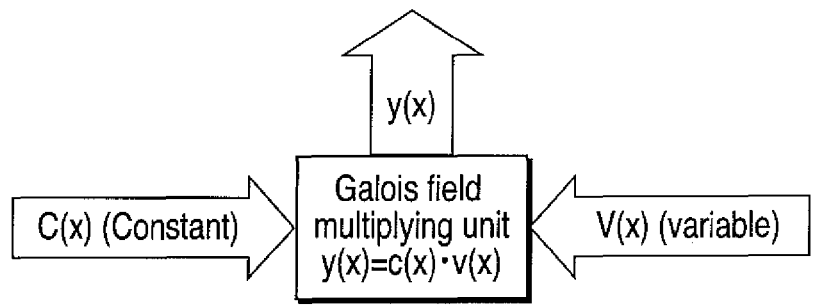
FIG. 3 is a block diagram illustrating an operating principle of the M-sequence generator incorporated in the random error generating device of FIG. 1.
FIG. 4 is a view illustrating a data list of specified power values ($\alpha^k$) for providing the M-sequence generator incorporated in the random error generating device of FIG. 1.

Specifically, as illustrated in FIG. 4, each value of the (m×m) matrix T computed by the above-described technique is written in an m-bit (m-place) data list table 20 of the power values ($\alpha^k, \alpha^{k+1}, \alpha^{k+2}, \ldots,$ and $\alpha^{k+m-1}$) of the specified power value ($\alpha^k$).

When the place corresponding to the register 12 of each of the power values ($\alpha^k, \alpha^{k+1}, \alpha^{k+2}, \ldots,$ and $\alpha^{k+m-1}$) of the specified power, value $\alpha^k$ in which the Galois field multiplication is performed to the bit data value fed back to each of the 0-th to (m−1)-th registers 12 is the value "1", a feedback path 18 is formed from the corresponding register 12 to the registers 12 whose bit data indicates the place through plural EXCLUSIVE-OR gates 17 that are of the Galois field multiplying unit 13.

The M-sequence generator 11 actually produced on the computer will be described with reference to FIGS. 5, 6, and 7.

Figure 6:
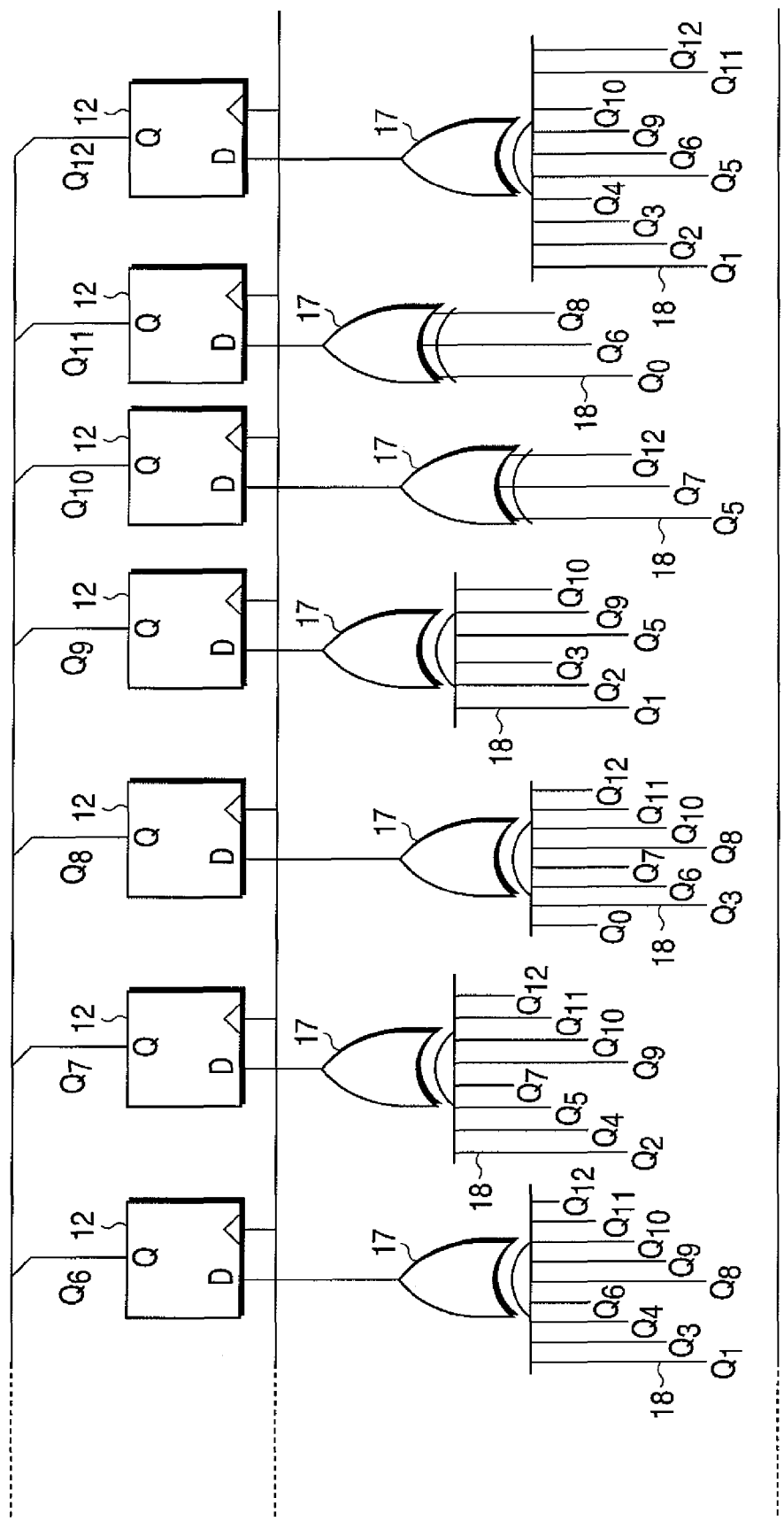
FIG. 6 is an actual circuit diagram partially illustrating the M-sequence generator incorporated in the random error generating device of FIG. 1.
Figure 7:
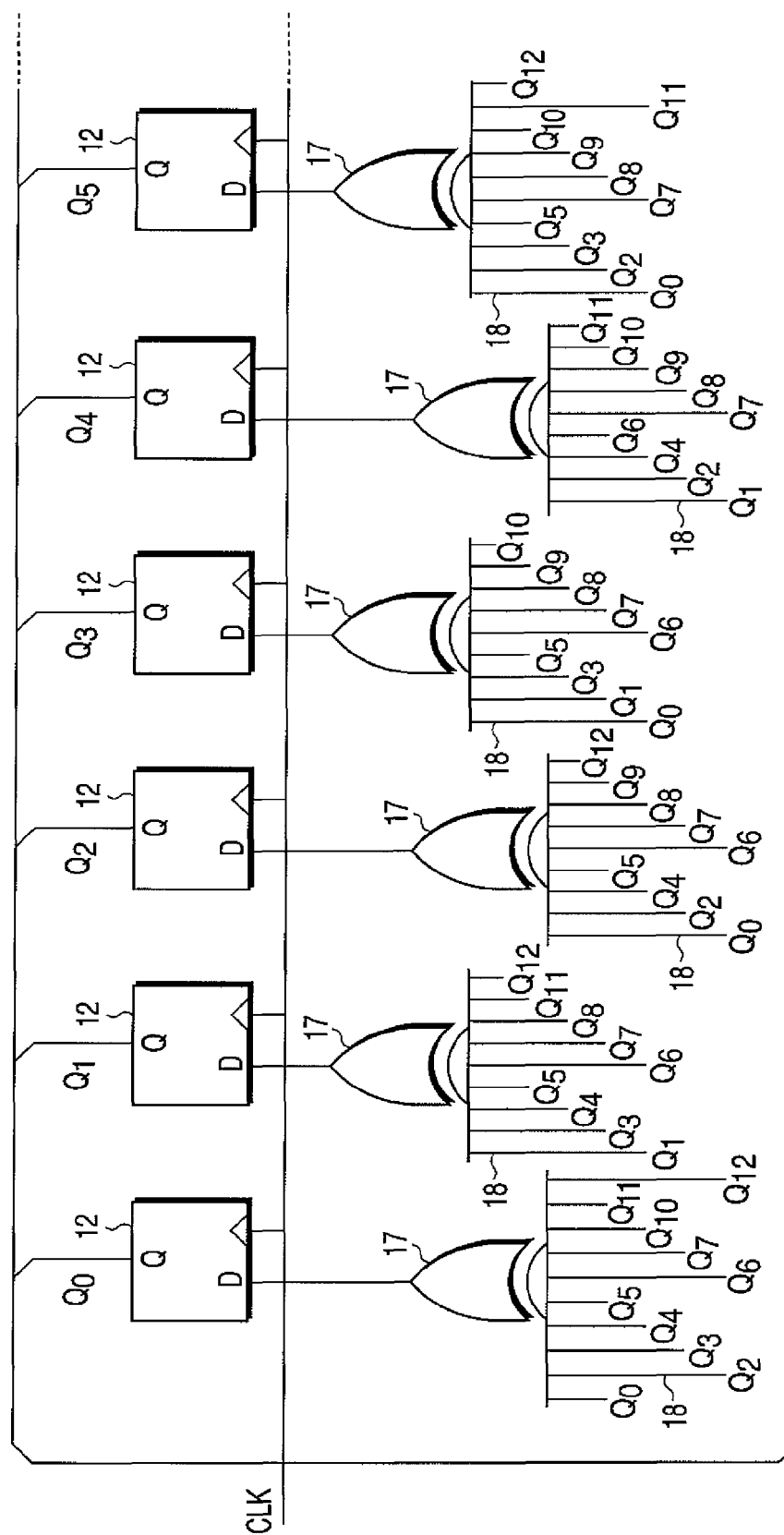
FIG. 7 is an actual circuit diagram partially illustrating the M-sequence generator incorporated in the random error generating device of FIG. 1.

In the M-sequence generator 11 of the first embodiment, as illustrated in FIGS. 6 and 7, a total of 13 (m=13) registers 12 $Q_0$ to $Q_{12}$ and 13 EXCLUSIVE-OR gates 17 to which the bit data is fed back from the registers 12 including the own register 12 are incorporated in the plural feedback paths 18.

In the M-sequence generator 11, the number m of registers 12 is set to m=13 (prime number) in FIG. 9, the pseudo-random number ($2^m - 1$) is 8191, and pseudo-random number of 8191 is the Mersenne prime number.

There are 630 primitive polynomials p(x) of the two-element Galois extension field GF ($2^m$) having the order m=13.

The following primitive polynomial p(x) of the pentanomial having the large number of terms is adopted in the 630 primitive polynomials p(x).

$$p(x) = x^{13} + x^5 + x^2 + x + 1$$

The specified power k of the primitive element α having the maximum m-bit configuration is set to 107 (k=107). The primitive element α is one of the roots of the primitive polynomial $p(x)=x^{13}+x^5+x^2+x+1$.

Accordingly, the specified power value $(\alpha^k)$ applied to the Galois field multiplying unit 13 in the M-sequence generator 11 becomes $(\alpha^{107})$.

The pieces of bit data (13 places) are computed and written in the data list table 20 of FIG. 5 (a). The pieces of bit data (13 places) are values in which power values $(\alpha^{107}, \alpha^{107+1}, \alpha^{107+2}, \ldots,$ and $\alpha^{107+12})$ that are of the power values $(\alpha^k, \alpha^{k+1}, \alpha^{k+2}, \ldots,$ and $\alpha^{k+m-1})$ of the specified power value $(\alpha^k)$ are expressed in the polynomial form.

The register 12 whose feedback path 18 is formed to the leading register 12($Q_0$) is a register 12 having a number corresponding to powers 0, 1, ..., and 12 that the pieces of bit data of each of the power values $(\alpha^{107}, \alpha^{107+1}, \alpha^{107+2}, \ldots,$ and $\alpha^{107+12})$ has "1" in the lowest place.

In the first embodiment, as illustrated in a search result table 21 of FIG. 5 (b), there are ten registers 12 $Q_0, Q_2, Q_3, Q_4, Q_5, Q_6, Q_7, Q_{10}, Q_{11},$ and $Q_{12}$.

The register 12 whose feedback path 18 is formed to the second register 12($Q_1$) is a register 12 having a number corresponding to powers 0, 1, ..., and 12 that the pieces of bit data of each of the power values $(\alpha^{107}, \alpha^{107+1}, \alpha^{107+2}, \ldots,$ and $\alpha^{107+12})$ has "1" in the second lowest place.

Similarly the register 12 whose feedback path 18 is formed to the second lowest register 12($Q_{11}$) is a register 12 having a number corresponding to powers 0, 1, ..., and 12 that the pieces of bit data of each of the power values $(\alpha^{107}, \alpha^{107+1}, \alpha^{107+2}, \ldots,$ and $\alpha^{107+12})$ has "1" in the twelfth lowest place.

In the first embodiment, as illustrated in a search result table 21, there are three registers 12 $Q_0, Q_6,$ and $Q_8$.

FIGS. 6 and 7 are actual circuit diagrams of the M-sequence generator 11 in which a feedback path 18 is actually described between the registers 12 in which the feedback path 18 registered in the search result table 21 of FIG. 5 (b) is formed.

Accordingly, when the Galois field multiplying unit 13 is adopted, the design processing speed of the M-sequence generator 11 is enhanced to be able to efficiently perform the circuit design.

Figure 16:
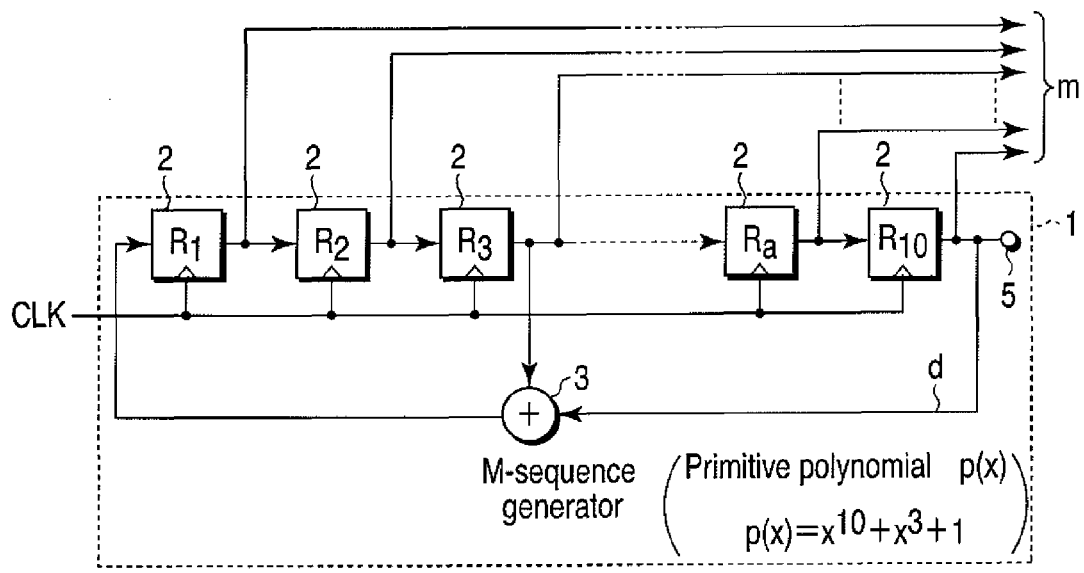
FIG. 16 is a block diagram illustrating a schematic configuration of an M-sequence generator incorporated in the conventional random error generating device.

The registers 12 of the M-sequence generator 11 does not have the shift register configuration of the conventional M-sequence generator 1 of FIG. 16, but the registers 12 of the M-sequence generator 11 are independently formed.

Therefore, in the M-sequence generator 11, because one piece of data is computed by one clock, the speed enhancement can be achieved in producing the random error signal.

Second Embodiment

Figure 8:
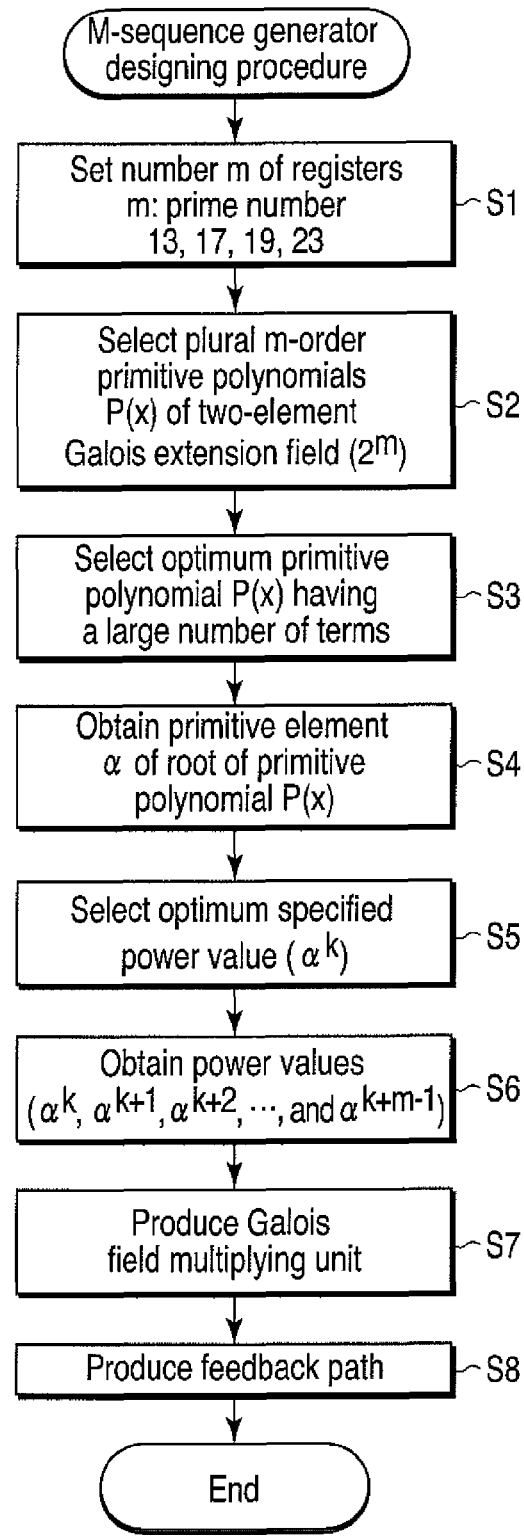
FIG. 8 is a flowchart illustrating a method for providing an M-sequence generator according to a second embodiment of the invention.

FIG. 8 is a flowchart illustrating a method for providing the M-sequence generator of FIGS. 6 and 7 according to a second embodiment of the invention.

In Step S1, the number m (m is a positive integer) of registers 12 used is selectively set.

Specifically, referring to list tables of FIGS. 9 and 10, the number m of registers is set to a value that is a prime number and a value that becomes a Mersenne prime number in which the maximum length period $(2^m-1)$ is a prime number.

Specifically one of 12 numbers "2, 3, 5, 7, 13, 17, 19, 31, 61, 89, 107, and 127" satisfying both the "prime number" and "Mersenne prime number" is selected.

The number m (order) of registers in which the plural primitive polynomials p(x) of the pentanomial having the relatively large number of terms can be realized by the two-element Galois extension field GF ($2^m$) is selected.

In the example, m=13 is selectively set.

Then the plural m-order primitive polynomials p(x) in the two-element Galois extension field GF ($2^m$) in which the selected number m is set to the order m is searched from a database not illustrated.

As illustrated in the primitive polynomial list 22 of FIG. 11, all the primitive polynomials p(x) existing in each order m (in Step S2) are stored in the database.

In the example, as illustrated in FIG. 9, 630 primitive polynomials p(x) exist in m=13.

At this point, the number λ(m) of primitive polynomials p(x) is expressed by the following equation using an Euler's function φ.

$$\lambda(m)=\phi(2^m-1)/m$$

One of the plural searched primitive polynomials p(x) is selected.

In the example, the following one primitive polynomial p(x) of the pentanomial is selected in the 630 primitive polynomials p(x) (Step S3).

$$p(x)=x^{13}+x^5+x^2+x+1$$

Then the primitive element a that is one of the roots of the selected primitive polynomial p(x) is computed.

Specifically it is assumed that each primitive element α that is of the root of the typical primitive polynomial p(x) is previously computed and stored in the database of the computer.

Accordingly, one primitive element α is selected from the database (Step S4).

The specified power values $(\alpha^k)$ of at least the power of two (k≧2) are selected when the two-element Galois extension field GF ($2^m$) is expressed by the following series of the power of the primitive element a (Step S5).

$$(\alpha^{1k}),(\alpha^{2k}),(\alpha^{3k}),$$

Desirably the power k is about ⅓ of the maximum length period $(2^m-1)$.

In the example, the power k is set to k=107 that is about 1/20 of the maximum length period $(2^m-1)=8191$.

Not the primitive element a but the specified power value $(\alpha^k)$ is used as the pieces of data sequentially multiplied in synchronization with the clock (CLK), so that the bit data written in each register 12 every clock can further be randomized.

The power values $(\alpha^k, \alpha^{k+1}, \alpha^{k+2}, \ldots,$ and $\alpha^{k+m-1})$ of the specified reference power value $\alpha^k$ with which the Galois field multiplication is performed to the data value fed back to each of the 0-th to (m−1)-th registers 12 of the selected specified reference power value $(\alpha^k)$ is computed.

The power values $(\alpha^k, \alpha^{k+1}, \alpha^{k+2}, \ldots,$ and $\alpha^{k+m-1})$ of each specified reference power values $\alpha^k$ are written in data list table 20 as illustrated in FIGS. 4 and 5 (a) (Step S6).

As illustrated in FIG. 1, in each time the clock (CLK) is fed, the power value $(\alpha^k)$ is set to the Galois field multiplying unit 13 that performs the Galois field multiplication with respect to the bit data value fed back to each register 12 (Step S7).

As described above, when the place corresponding to the register of the power values $(\alpha^k, \alpha^{k+1}, \alpha^{k+2}, \ldots,$ and $\alpha^{k+m-1})$ of the power values $(\alpha^k, \alpha^{k+1}, \alpha^{k+2}, \ldots,$ and $\alpha^{k+m-1})$ corresponding to the registers 12 described in the data list table 20 has the value "1", the feedback path 18 is formed from the corresponding register 12 to the registers 12 whose bit data indicates the place through the plural EXCLUSIVE-OR gates 17 that are of the Galois field multiplying unit 13 (Step S8).

As a result, the M-sequence generator 11 of FIGS. 2, 6, and 7 is provided.

The invention is not limited to the M-sequence generators of the first and second embodiments.

Third Embodiment

In an M-sequence generator according to a third embodiment of the invention, when one of the roots of the polynomial having the large number of terms in the plural polynomials of the two-element Galois extension field GF ($2^m$) in which the number m (m is a positive integer which is 2 or more) of registers 12 is set to the order m is not the element α but an element e, the period of the periodic sequence {(α1 k), (α2 k), (α3 k), . . . } in which the specified power value ($e^k$) of the element e of at least 2 (k≧2) falls within the maximum length period ($2^m$-1).

In the M-sequence generator of the third embodiment, the adopted polynomial (generating polynomial) is not limited to the primitive polynomial p(x).

Accordingly, the period of the bit data actually supplied from the M-sequence generator is not always matched with the maximum length period ($2^m$-1).

However, in the M-sequence generator of the third embodiment, the number m of registers can arbitrarily be set.

Fourth Embodiment

Figure 13:
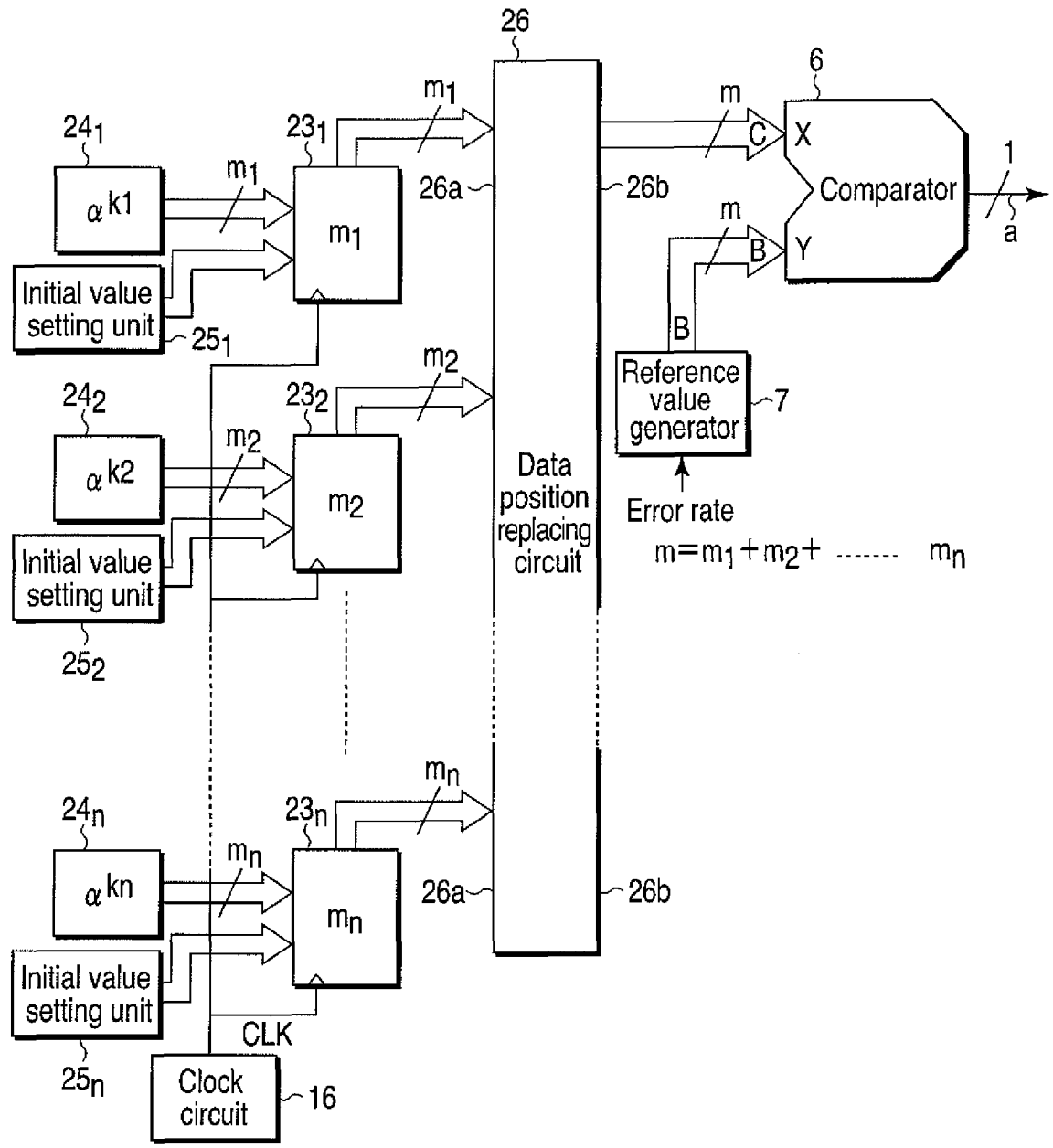
FIG. 13 is a block diagram illustrating a schematic configuration of a random error generating device according to a fourth embodiment of the invention.

FIG. 13 is a view illustrating a schematic configuration of a random error generating device according to a fourth embodiment of the invention.

In FIG. 13, the same component as the random error generating device of the first embodiment of FIG. 1 is denoted by the same numeral, and the overlapping description is omitted.

N M-sequence generators $23_1$, $23_2$, . . . , and $23_n$ are provided in the random error generating device of the fourth embodiment.

The M-sequence generators $23_1$, $23_2$, and $23_n$ have the configurations that are substantially identical that of the M-sequence generator 11 of the first embodiment. The M-sequence generators $23_1$, $23_2$, . . . , and $23_n$ differ from the M-sequence generator 11 in that the numbers m of registers m are set to different values $m_1$, $m_2$, . . . , and $m_n$.

The powers k of the power values ($α^k$) that the power value setting units $24_1$, $24_2$, and $24_n$ apply the Galois field multiplying units 13 in the M-sequence generators $23_1$, $23_2$, and $23_n$ are set to different values k=$k_1$, $k_2$, . . . , and $k_m$ in each of the M-sequence generators $23_1$, $23_2$, and $23_n$.

The pseudo-random number values that the initial value setting unit $25_1$, $25_2$, and $25_n$ initially set to the registers 12 in the M-sequence generators $23_1$, $23_2$, and $23_n$ are also set to different values in each of the M-sequence generators $23_1$, $23_2$, and $23_n$.

One clock circuit 16 applies the common clock (CLK) to the M-sequence generators $23_1$, $23_2$, . . . , and $23_n$.

In each time clock (CLK) is supplied from the clock circuit 16, the M-sequence generators $23_1$, $23_2$, . . . , and $23_n$ supply the parallel pieces of bit data having the bit configuration of $m_1$, $m_2$, . . . , and $m_n$ and deliver the parallel pieces of bit data to an input unit 26a of a data position replacing circuit 26.

The input unit 26a of the data position replacing circuit 26 comprises input terminals of the number of bits m= $m_1$+$m_2$+, . . . , +$m_n$ to which the number of bits $m_1$, $m_2$, . . . , and $m_n$ of the parallel pieces of bit data supplied from the M-sequence generators $23_1$, $23_2$, . . . , and $23_n$.

On the other hand, m output terminals that are identical to the number of input terminals of the input unit 26a are provided in an output unit 26b of the data position replacing circuit 26.

In the data position replacing circuit 26, connection destination from a total of m input terminals of the input unit 26a to the output terminals of the output unit 26b are randomly distributed.

Accordingly, the data position replacing circuit 26 randomly replaces a total of m-bit data positions fed into the input unit 26a and supplies the m-bit data from the output unit 26b.

Therefore, the randomness of the m-bit data that is supplied from the data position replacing circuit 26 in synchronization with the clock (CLK) is improved.

The parallel m-bit data supplied from the output unit 26b of the data position replacing circuit 26 is applied to one (X terminal) of the input terminals of the comparator 6.

The parallel m-bit reference value that is inputted by the operator using the reference value setting circuit 7 is fed into the other input terminal (Y terminal) of the comparator 6.

The comparator 6 supplies the random error signal a that becomes the error bit when the numerical value A taken in from one (X terminal) of the input terminals is equal to or lower than the reference value B taken in from the other input terminal (Y terminal).

In the random error generating device of the fourth embodiment, the period of the bit data string supplied in each of the M-sequence generators $23_1$, $23_2$, . . . , and $23_n$ varies because the number of registers in each of the M-sequence generators $23_1$, $23_2$, . . . , and $23_n$ is set to different value.

Additionally, the data position replacing circuit 26 replaces the data positions of the pieces of bit data of the M-sequence generators $23_1$, $23_2$, . . . , and $23_n$ over all the M-sequence generators $23_1$, $23_2$, . . . , and $23_n$, so that the randomness of the random error signal a supplied from the random error generating device can further be improved.

In the fourth embodiment, the period substantially equal to that of one M-sequence generator 11 of FIG. 1 is realized by the n M-sequence generators $23_1$, $23_2$, . . . , and $23_n$.

At this point, the circuit configuration that obtains the substantially equal period is simplified compared with one M-sequence generator 11 of FIG. 1.

That is, it is demonstrated experimentally and theoretically that generally a circuit configuration scale of the M-sequence generator is substantially proportional to the square of the number of registers (order m).

This is because the circuit scale in which the multiplication on the Galois field is substantially proportional to the square of the order m.

For example, the circuit scale of $30^2$×K (constant)=900×K is required when the maximum length period ($2^m$-1) of the order m=30 is realized by one M-sequence generator 11.

On the other hand, when the maximum length period ($2^m$-1) of the order m=30 is realized by two M-sequence generators 23 of the order $m_1$=13 and the order $m_2$=17 (m=$m_1$+$m_2$=30), the total of the circuit scales becomes $13^2$K+$17^2$K= (169+289) K=458×K. Therefore, the circuit scale can largely be reduced compared with one M-sequence generator 11.

When plural M-sequence generators 23 are used in parallel to produce the periodic sequence having the longer period, because the actually realized combination period becomes the least common multiple of the periods of the M-sequence generators 23, desirably the relationship of orders $m_1$ and $m_2$ of the M-sequence generator 23 is set to a relatively prime relationship.

Fifth Embodiment

Figure 14:
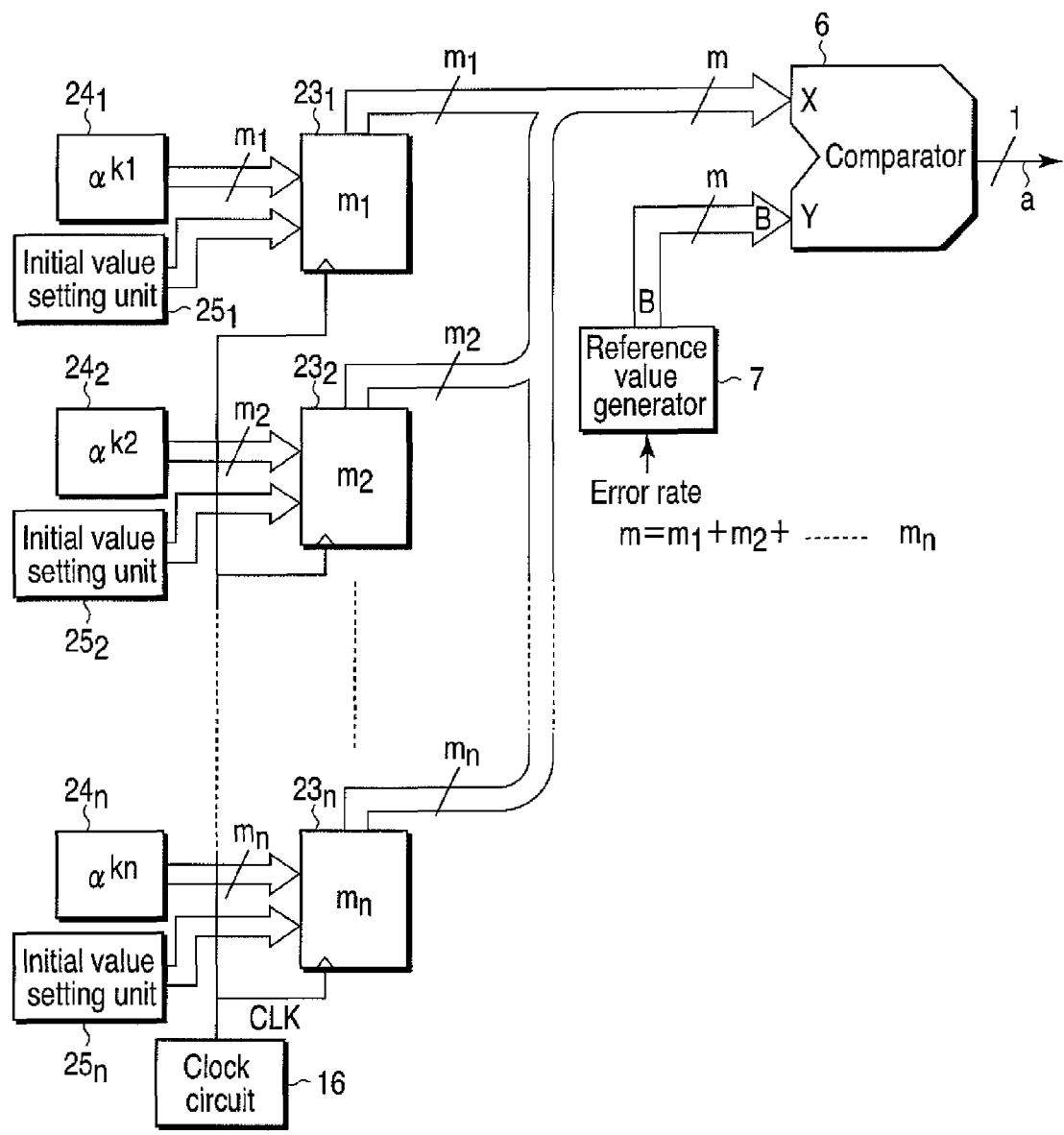
FIG. 14 is a block diagram illustrating a schematic configuration of a random error generating device according to a fifth embodiment of the invention.

FIG. 14 is a view illustrating a schematic configuration of a random error generating device according to a fifth embodiment of the invention.

In FIG. 14, the same component as the random error generating device of the fourth embodiment of FIG. 13 is denoted by the same numeral, and the overlapping description is omitted.

The data position replacing circuit 26 in the random error generating device of the fourth embodiment of FIG. 13 is removed in the random error generating device of the fifth embodiment.

Further, the relatively prime relationship is maintained in the numbers of registers $m_1, m_2, \ldots$, and $m_n$ of the M-sequence generators $23_1, 23_2,$ and $23_n$.

In each time the clock (CLK) supplied from the clock circuit 16, the M-sequence generators $23_1, 23_2, \ldots$, and $23_n$ supply the parallel pieces of bit data having the bit configurations $m_1, m_2, \ldots$, and $m_n$ and apply the parallel pieces of bit data to one (X terminal) of the input terminals of the comparator 6.

One (X terminal) of the input terminals of the comparator 6 comprises the terminal of the number of bits $m = m_1 + m_2 +, \ldots,$ and $m_n$ to which the numbers of bits $m_1, m_2, \ldots,$ and $m_n$ of the parallel pieces of bit data supplied from the M-sequence generators $23_1, 23_2, \ldots,$ and $23_n$ are added.

On the other hand, the parallel m-bit reference value that is inputted by the operator using the reference value setting circuit 7 is fed into the other input terminal (Y terminal) of the comparator 6.

The comparator 6 supplies the random error signal a that becomes the error bit when the numerical value A taken in from one (X terminal) of the input terminals is equal to or lower than the reference value B taken in from the other input terminal (Y terminal).

In the random error generating device of the fifth embodiment, the period of the bit data string supplied in each of the M-sequence generators $23_1, 23_2, \ldots,$ and $23_n$ varies because the number of registers in each of the M-sequence generators $23_1, 23_2,$ and $23_n$ is set to the relatively prime relationship.

Accordingly, because the period of the data stream of the plural pieces of bit data can be lengthened over all the M-sequence generators $23_1, 23_2,$ and $23_n$ fed into one (X terminal) of the input terminals of the comparator 6, the randomness of the random error signal a supplied from the error generating device can sufficiently be improved.

Generally, in the test apparatus that performs various tests to various communication instruments incorporated in the digital communication network in which the electric signal cable is used or the optical communication network in which the optical fiber cable is used, it is necessary that the test signal matched with actual usage of the communication instrument of the test target be fed into the communication instrument to evaluate a reply operation of the communication instrument.

In one of kinds of the evaluation tests of the communication instrument, the test signal intentionally including the error matched with the actual usage is adopted as the test signal delivered to the communication instrument of the measurement target. Therefore, it is necessary to evaluate that the communication instrument is normally operated to what extent of an incidence rate (error rate) E of an error included in the test signal.

The random error generating device of the invention has the specified error rate that is available as the test signal, and the random error generating device supplies the random error signal whose error distribution approximates the error distribution caused by the noise generated in the optical communication or electric communication.

The M-sequence generator of the invention can be applied in order to realize the random error generating device.

What is claimed is:

1. An M-sequence generator comprising a plurality of series-connected registers and a plurality of EXCLUSIVE-OR gates which feed back pieces of bit data stored in the registers to the registers in each time a clock is fed into said plurality of registers, the pieces of bit data being supplied in parallel from said each register,
   wherein a period of a cyclic group $\{(\alpha^{1k}), (\alpha^{2k}), (\alpha^{3k}), \ldots\}$ falls within a maximum length period $(2^m-1)$, the cyclic group $\{(\alpha^{1k}), (\alpha^{2k}), (\alpha^{3k}), \ldots\}$ being produced as an element $(\alpha^k)$ that is of a generating element $(\alpha^k)$, the element $(\alpha^k)$ being obtained by raising a root $\alpha$ of a polynomial to a specified power value k of at least 2 ($k \geq 2$), the polynomial having the large number of terms in a plurality of polynomials of a Galois field $GF(2^m)$ in which the number m (m is a positive integer which is 2 or more) of plurality of registers is set to an order m, and
   the M-sequence generator comprises a Galois field multiplying unit comprising said plurality of EXCLUSIVE-OR gates, pieces of bit data supplied in parallel from the registers is fed into one end of the Galois field multiplying unit in each time the clock is fed while the generating element $(\alpha^k)$ is fed into the other end, the Galois field multiplying unit performing Galois field multiplication between said each piece of bit data and the generating element $(\alpha^k)$, the EXCLUSIVE-OR gate supplying the Galois field multiplication result as feedback bit data to each register in parallel.

2. The M-sequence generator according to claim 1, wherein, when one of the roots of the polynomial is not the $\alpha$ but e, a period of a cyclic group $\{(e^{1k}), (e^{2k}), (e^{3k}), \ldots\}$ falls within the maximum length period $(2^m-1)$, the cyclic group $\{(e^{1k}), (e^{2k}), (e^{3k}), \ldots\}$, being produced as an element $(e^k)$ that is of a generating element $(e^k)$, the element $(e^k)$ being obtained by raising the root e of the polynomial to a specified power value k of at least 2 ($k \geq 2$),
   in the Galois field multiplying unit, in each time the clock is fed, pieces of bit data supplied in parallel from the registers is fed into one end while the generating element $(e^k)$ is fed into the other end, and
   the Galois field multiplying unit performs Galois field multiplication between said each piece of bit data and the generating element $(\alpha^k)$.

3. A method for providing an M-sequence generator comprising a plurality of series-connected registers and a plurality of EXCLUSIVE-OR gates which feed back pieces of bit data stored in the registers to the registers in each time a clock is fed into said plurality of registers, the pieces of bit data being supplied in parallel from said each register,
   the M-sequence generator providing method comprising:
   a register number selecting step of selectively setting the number m (m is a positive integer) of said plurality of registers to 3 or more;
   a primitive polynomial searching step of searching a plurality of m-order primitive polynomials in a two-element Galois extension field $GF(2^m)$ in which the number m of said plurality of registers selected in the register number selecting step is set to the order m from a database;
   a primitive polynomial selecting step of selecting one of said plurality of primitive polynomials searched in the primitive polynomial searching step;

a primitive element computing step of obtaining a primitive element α from the database, the primitive element α being a root of the one primitive polynomial selected in the primitive polynomial selecting step;

a specified power value selecting step of selecting a specified power value $\alpha^k$ having the power of 2 or more ($k \geq 2$) when the two-element Galois extension field $GF(2^m)$ is expressed by a series of the power of primitive element α;

a power value computing step of computing power values $(\alpha^k, \alpha^{k+1}, \alpha^{k+2}, \ldots, \alpha^{k+m-1})$ of specified reference power values $\alpha^k$ that is used to perform Galois field multiplication to data values fed back to each of first to m-th registers of said series-connected plurality of registers of the specified reference power value $\alpha^k$ selected in the specified power value selecting step;

a Galois field multiplying unit setting step of setting a Galois field multiplying unit in each time the clock is fed into the series-connected plurality of registers, the Galois field multiplying unit performing Galois field multiplication of the power value ($\alpha^k$) to the values of the pieces of bit data fed back to said each register; and a feedback path producing step of producing a feedback path from the corresponding register to the register in which a place indicates bit data through said plurality of EXCLUSIVE-OR gates constituting the Galois field multiplying unit, when the place corresponding to said each register of power values ($\alpha^k, \alpha^{k+1}, \alpha^{k+2}, \ldots, \alpha^{k+m-1}$) corresponding to said each register computed in the power value computing step has a value of "1".

4. A random error generating device comprising:

an M-sequence generator that comprises a plurality of series-connected registers and a plurality of EXCLUSIVE-OR gates which feed back pieces of bit data stored in the registers to the registers in each time a clock is fed into said plurality of registers, the pieces of bit data being supplied in parallel from said each register; and a comparator in which a plurality of pieces of bit data supplied in parallel from the M-sequence generator in synchronization with the clock is fed into one end, said plurality of pieces of fed bit data being taken in as one numerical value, the comparator supplying a random error signal that becomes an error bit when a numerical value of said plurality of pieces of bit data is equal to or lower than a reference value corresponding to a specified error rate fed into the other end, wherein, in the M-sequence generator, a period of a cyclic group $\{(\alpha^{1k}), (\alpha^{2k}), (\alpha^{3k}), \ldots\}$ falls within a maximum length period ($2^m$-1), the cyclic group $\{(\alpha^{1k}), (\alpha^{2k}), (\alpha^{3k}), \ldots\}$ being produced as an element ($\alpha^k$) that is of a generating element ($\alpha^k$), the element ($\alpha^k$) being obtained by raising a root α of a polynomial to a specified power value k of at least 2 ($k \geq 2$), the polynomial having the large number of terms in a plurality of polynomials of a Galois field $GF(2^m)$ in which the number m (m is a positive integer which is 2 or more) of plurality of registers is set to an order m, and the M-sequence generator comprises a Galois field multiplying unit comprising said plurality of EXCLUSIVE-OR gates, pieces of bit data supplied in parallel from the registers is fed into one end of the Galois field multiplying unit in each time the clock is fed while the generating element ($\alpha^k$) is fed into the other end, the Galois field multiplying unit performing Galois field multiplication between said each piece of bit data and the generating element ($\alpha^k$), the EXCLUSIVE-OR gate supplying the Galois field multiplication result as feedback bit data to each register in parallel.

5. The random error generating device according to claim 4, wherein a feedback path of bit data stored in each register is defined with respect to each register through said plurality of EXCLUSIVE-OR gates by Galois field multiplication between a plurality of pieces of bit data supplied in parallel from said each register in each time the clock is fed and the generating element ($\alpha^k$).

6. The random error generating device according to claim 4, comprising:

a plurality of M-sequence generators as the M-sequence generator; and a data position replacing circuit into which a plurality of pieces of bit data supplied in parallel from each of said plurality of M-sequence generators in synchronization with a clock, the data position replacing circuit replacing data positions of said plurality of pieces of bit data, wherein said plurality of pieces of bit data whose data positions are replaced by the data position replacing circuit are fed into one end of the comparator.

7. The random error generating device according to claim 4, wherein numbers m (m is a positive integer which is 2 or more) of said plurality of registers have a relatively prime relationship, a plurality of M-sequence generators is provided as the M-sequence generator, and a plurality of pieces of bit data supplied in parallel from each of said plurality of M-sequence generators in synchronization with a clock are fed into one end of the comparator over pieces of bit data of all the M-sequence generators.

8. The random error generating device according to claim 4, wherein the number m of said plurality of registers is set to a prime number such that the maximum length period ($2^m$-1) becomes a Mersenne prime number, the number of selected primitive polynomials is set about half the number m of registers, and a power k of the specified power value $\alpha^k$ is set to about ⅓ of the maximum length period ($2^m$-1).

9. The random error generating device according to claim 4, further comprising an initial setting unit which initially sets a pseudo-random number value to said each register.

* * * * *